(12) United States Patent
Cui et al.

(10) Patent No.: US 11,756,932 B2
(45) Date of Patent: Sep. 12, 2023

(54) SLOPED INTERCONNECTOR FOR STACKED DIE PACKAGE

(71) Applicant: Western Digital Technologies, Inc., San Jose, CA (US)

(72) Inventors: Xianlu Cui, Shanghai (CN); Junrong Yan, Shanghai (CN); Cheekeong Chin, Shanghai (CN); Zhonghua Qian, Shanghai (CN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/107,838

(22) Filed: Nov. 30, 2020

(65) Prior Publication Data

US 2021/0407967 A1 Dec. 30, 2021

(30) Foreign Application Priority Data

Jun. 30, 2020 (CN) .......................... 202010619593.5

(51) Int. Cl.
*H01L 25/065* (2023.01)
*H01L 25/00* (2006.01)
*H01L 23/00* (2006.01)

(52) U.S. Cl.
CPC ........ *H01L 25/0657* (2013.01); *H01L 23/562* (2013.01); *H01L 25/50* (2013.01); *H01L 2225/06506* (2013.01); *H01L 2225/06517* (2013.01); *H01L 2225/06548* (2013.01); *H01L 2225/06562* (2013.01); *H01L 2225/06572* (2013.01); *H01L 2225/06582* (2013.01)

(58) Field of Classification Search
CPC ......... H01L 23/562; H01L 2225/06506; H01L 2225/06517; H01L 2225/06548; H01L 2225/06562; H01L 2225/06572; H01L 2225/06582; H01L 25/0657; H01L 25/50; H10B 80/00
See application file for complete search history.

(56) References Cited

U.S. PATENT DOCUMENTS

| 10,276,545 | B1* | 4/2019 | Huang | .................... H01L 24/92 |
| 2011/0037158 | A1* | 2/2011 | Youn | ...................... H01L 24/33 |
| | | | | 257/692 |
| 2019/0341372 | A1* | 11/2019 | She | ......................... H01L 23/50 |

* cited by examiner

*Primary Examiner* — Timor Karimy
(74) *Attorney, Agent, or Firm* — Kunzler Bean & Adamson, PC

(57) ABSTRACT

A semiconductor device package includes a mechanical support structure that provides mechanical support to a stack of dies, where the dies are laterally offset from each other. The support structure has a sloped surface that is disposed at a non-perpendicular and non-parallel angle to other surfaces of the mechanical support structure. Electrical contacts are disposed on the sloped surface of the mechanical support structure for electrically interfacing with the stacked dies and on a different surface of the mechanical support structure for electrically interfacing with a substrate.

14 Claims, 12 Drawing Sheets

SLOPED INTERCONNECTOR FOR STACKED DIE PACKAGE

CROSS-REFERENCES TO RELATED APPLICATIONS

This application claims the benefit of Chinese Patent Application Number 202010619593.5 entitled "SLOPED INTERCONNECTOR FOR STACKED DIE PACKAGE" and filed on Jun. 30, 2020 for Xianlu Cui, et al., which is incorporated herein by reference.

TECHNICAL FIELD

The present disclosure, in various embodiments, relates to integrated circuit packaging and more particularly relates to a sloped interconnector for a stacked die package.

BACKGROUND

As integrated circuit technology progresses with an ever-increasing transistor density, the number of inputs and outputs per integrated circuit die also increases, to accommodate communications for the additional transistors and larger circuits. Further, for three-dimensional assembly structures, such as multi-die stacks, wire bond and other traditional interconnect technologies may be insufficient for the increased number of inputs and outputs. Mechanical support for such three-dimensional assembly structures may also be insufficient, causing die tilt, die warpage and bending, exposed die, and other structural failures and reliability issues.

SUMMARY

Apparatuses are presented for a sloped interconnector for stacked integrated circuit devices. In one embodiment, a mechanical support structure provides mechanical and/or electrical support for a plurality of integrated circuit dies. A sloped surface of a mechanical support structure, in certain embodiments, is disposed at a non-perpendicular and/or non-parallel angle to other surfaces of the mechanical support structure. In some embodiments, a plurality of electrical contacts are disposed on a sloped surface of a mechanical support structure for electrically interfacing with a plurality of integrated circuit dies.

Other apparatuses are presented for a sloped interconnector for stacked integrated circuit devices. In one embodiment, an apparatus includes means for mechanically supporting a plurality of laterally offset, stacked, integrated circuit dies. An apparatus, in certain embodiments, includes means for providing electrical communication between integrated circuit die electrical contacts along stacked, overhanging edges of a plurality laterally offset, stacked integrated circuit dies and a substrate through means for mechanically supporting the plurality of laterally offset, stacked, integrated circuit dies.

Systems are presented for a sloped interconnector for a stacked integrated circuit die package. In one embodiment, a plurality of integrated circuit dies are stacked and laterally offset relative to each other. A plurality of integrated circuit dies, in some embodiments, comprise a plurality of integrated circuit die electrical contacts along an edge of the plurality of integrated circuit dies. In certain embodiments, a mechanical support structure comprises a sloped surface comprising a plurality of input/output electrical contacts electrically coupled to a plurality of integrated circuit die electrical contacts of a plurality of integrated circuit dies.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
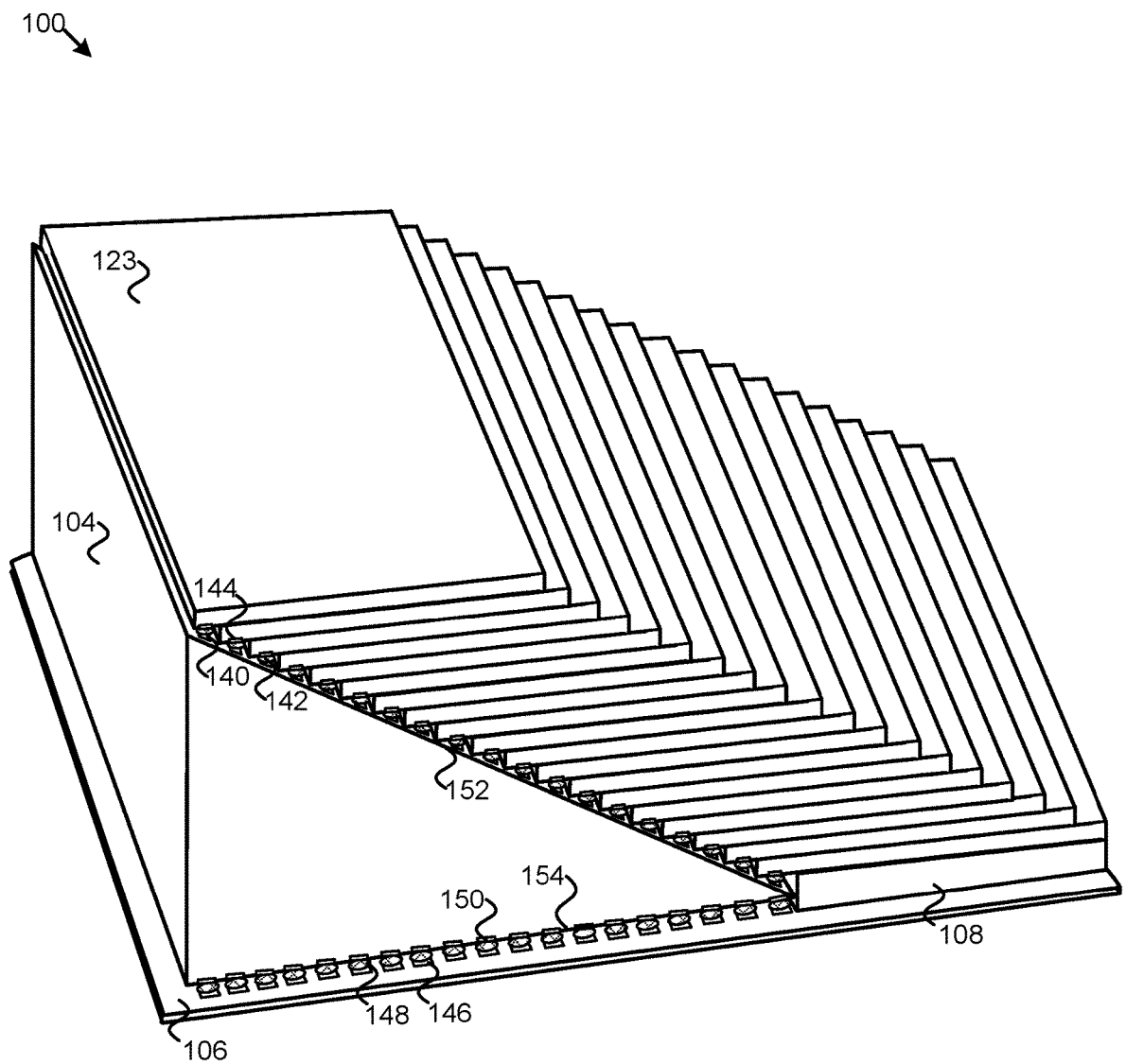
FIG. 1A is a schematic block diagram of one embodiment of a system for a mechanical support structure for stacked integrated circuit dies.

Aspects of the present disclosure may be embodied as an apparatus, system or method. Accordingly, aspects of the present disclosure may take the form of an entirely hardware embodiment or an embodiment combining software and hardware aspects that may all generally be referred to herein as a "circuit," "module," "apparatus," or "system."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, dies, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, dies, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, dies, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a schematic block diagram of one embodiment of a system 100 for a mechanical support structure 104 for a plurality of stacked integrated circuit dies 123. The system 100, in the depicted embodiment, includes a mechanical support structure 104 (e.g., a sloped interconnector 104 or the like), a substrate 106, a spacer 108, and a plurality of stacked dies 123. The mechanical support structure 104, in the depicted embodiment, includes a plurality of electrical contacts 140 coupled (e.g., with solder bumps 142 or the like) to corresponding die electrical contacts 144 (e.g., along edges of the plurality of dies 123 toward the mechanical support structure 104, or the like) and a plurality of electrical contacts 150 coupled (e.g., with solder bumps 148 or the like) to corresponding substrate electrical contacts 146 of the substrate 106.

The mechanical support structure 104, in certain embodiments, may comprise a sloped interconnector that provides mechanical support and/or electrical connections for a plurality of dies 123, within an integrated circuit package, housing, or the like. For example, in various embodiments, a mechanical support structure 104 may reduce and/or eliminate tilting, bending, cracking, and/or failing of the associated dies 123, during manufacturing, assembly, and/or packaging, during use in the field, or the like. Without a sloped interconnector 104 or other mechanical support structure 104, in some embodiments, stacked dies 123 (e.g., coupled using bond wires or the like) may have an insufficient number of electrical contacts (e.g., insufficient input/output (I/O) count), may become tilted during manufacturing and/or assembly, may bend, may become exposed through packaging, may fail and/or have other reliability issues.

The sloped interconnector or other mechanical support structure 104, may comprise and/or be formed of a substantially insulating, non-conductive base material, such as silicon (e.g., without doping, oxidized, heated, or the like to provide insulating properties), polycrystalline silicon, glass, ceramic, and/or another insulator. The sloped interconnector 104 or other mechanical support structure 104, in certain embodiments, comprises the plurality of electrical contacts 140, 150, corresponding to one or more electrical contacts 144, 146 disposed on one or more of the dies 123 and/or the substrate 106, as well as one or more conductive electrical traces, through-silicon-vias, and/or other electrical interconnects. An electrical contact 140, 144, 146, 150, as used herein, comprises a conductive connection, such as a metallic or otherwise conductive pad, pin, port, trace, pillar, or the like. Electrical contacts 140, 144, 146, 150 may be electrically and/or mechanically coupled using solder, conductive wires, ports, clamps, clips, or the like.

For example, in the depicted embodiment, electrical contacts 150 of the mechanical support structure 104 are electrically and mechanically coupled to electrical contacts 146 of the substrate 106 using a ball grid array or the like of solder balls 148 and/or solder bumps 148, or the like. Similarly, in the depicted embodiment, electrical contacts 144 of the plurality of dies 123 are electrically and mechanically coupled to electrical contacts 140 on a sloped surface of the mechanical support structure 104 using a ball grid array or the like of solder balls 148 and/or solder bumps 148, or the like.

An integrated circuit die 123, as used herein, comprises one or more fabricated electrical circuits and/or other electrical components (e.g., a monolithic integrated circuit or the like). For example, an integrated circuit die 123 may comprise a semiconductor device (e.g., silicon, gallium arsenide, or the like) with one or more gates, transistors, capacitors, resistors, diodes, power supplies, amplifiers, traces, vias, other electrical connections, electrical contacts, and/or other integrated electrical components. The integrated circuit die 123 may be fabricated using a photolithographic and/or chemical process in which one or more layers of semiconductors, metals or other conductors, insulators, or the like are deposited on and/or removed from a semiconductor substrate to form electrical circuits.

Multiple chips, die planes, dies and/or other integrated circuit devices 123, in one embodiment, may be stacked or otherwise combined in a multi-die 123 arrangement. For example, multiple integrated circuit dies 123 may be stacked and laterally offset relative to each other, to provide room for electrical connections (e.g., with electrical contacts 140 of a mechanical support structure 104, between the stacked dies 123, or the like). In some embodiments, multiple dies 123 may be coupled, either directly or indirectly, to the same substrate 106 or chip carrier 106 (e.g., through a mechanical support structure 104, or the like), and may communicate with each other through the substrate 106 and/or chip carrier 106. Multiple dies 123 may be disposed within the same package and/or housing (e.g., for protection, mechanical support, or the like), such as a resin, plastic or other polymer, ceramic, and/or other sturdy material that houses and/or encapsulates the dies 123 and the mechanical support structure 104, with one or more electrical traces, pins, contacts, or the like extending from the dies 123 (e.g., through the mechanical support structure 104 and/or the substrate 106) through the package or other housing for external electrical communications out of the package.

A mechanical support structure 104, in certain embodiments, has at least one sloped surface 152, with an angle and/or slope corresponding to an offset between consecutive integrated circuit devices 123, allowing each of the plurality of dies 123 to be electrically coupled to the same mechanical support structure 104. In some embodiments, the sloped surface 152 of the mechanical support structure 104 is at a non-perpendicular and non-parallel angle to one or more other surfaces and/or sides of the mechanical support structure 104 (e.g., not a ninety degree angle, not square, or the like).

For example, in the depicted embodiment, the mechanical support structure 104 comprises a triangular wedge shape (e.g., with a right triangle profile), to provide a sloped surface 152 for electrically and mechanically interfacing with and supporting the plurality of stacked dies 123. In other embodiments, a mechanical support structure 104 may comprise a different shape with a sloped surface 152 with a non-perpendicular and non-parallel angle to one or more other surfaces and/or sides, such as a parallelogram, a scalene triangle, and/or another shaped profile with a sloped surface 152.

While the sloped surface 152, in the depicted embodiment, has a substantially constant angle (e.g., a substantially straight line), in other embodiments, a sloped surface 152 of a mechanical support structure 104 may comprise one or more steps, cutouts, or the like (e.g., corresponding to and/or shaped to receive one or more of the integrated circuit devices 123). An overall slope and/or overall angle of a sloped surface 152 with one or more steps and/or other cutouts (e.g., measured from one end and/or edge of the mechanical support structure 104 to an opposite end and/or edge), in some embodiments, may be non-perpendicular and/or non-parallel with regard to one or more other surfaces of the mechanical support structure 104, even if one or more surfaces of a step and/or cutout may be parallel and/or perpendicular to one or more other surfaces.

A plurality of integrated circuit device electrical contacts 144 (i.e., die bonding pads), in the depicted embodiment, are disposed along an edge of the dies 123, aligned to interface with the plurality of electrical contacts 140 disposed on the sloped surface 152 of the mechanical support structure 104.

In the depicted embodiment, each die 123 comprises one row of electrical contacts 144. In other embodiments, the die 123 may comprise two rows, three rows, four rows, five rows, six rows, seven rows, eight rows, or more rows of electrical contacts 144, and/or may comprise a non-row pattern of electrical contacts 144.

In certain embodiments, the die 123 may comprise at least two rows of electrical contacts 144, and different rows of electrical contacts 144 may have different heights (e.g., to compensate for the non-perpendicular and/or non-parallel angle of the sloped surface 152 of the mechanical support structure 104). For example, different rows of electrical contacts 140, 144 may comprise different amounts of solder 142, one or more rows may comprise conductive pillars 140, 144 (e.g., metallic pillars such as copper pillars, or the like), and/or may otherwise comprise different heights. Different heights, in various embodiments, may be provided by providing different heights of electrical contacts 144 on an die 123 itself, different heights of corresponding electrical contacts 140 on the sloped surface 152 of the mechanical support structure 104, and/or providing different heights of electrical contacts 140, 144 on both the sloped surface 152 and the die 123.

In certain embodiments, the support structure 104 may provide electrical connections (e.g., metallic electrical traces, metalized through-silicon-vias, conductive layers, and/or other conductive pathways) between the electrical contacts 140 on the sloped surface 152 and electrical contacts 150 on a different surface 154 and/or elsewhere on the mechanical support structure 104 (e.g., for providing electrical signals from the integrated circuit devices 123 to the substrate 106, from one integrated circuit device 123 to another integrated circuit device 123, or the like). For example, electrical traces, through-silicon-vias, or the like may comprise a redistribution layer making electrical signals from one or more electrical contacts 140, 150 available in another location on the mechanical support structure 104. In this manner, in some embodiments, the mechanical support structure 104 may provide both a mechanical and an electrical interconnector for the dies 123 and the substrate 106.

The system 100, in the depicted embodiment, includes a spacer 108. The spacer 108, in certain embodiments, may be disposed between the dies 123 and the substrate 106 (e.g., providing mechanical support to the dies 123, aligning the dies 123 with the electrical contacts 140 disposed on the sloped surface 152 of the support structure 104, or the like). The spacer 108 may comprise and/or be formed of a substantially insulating, non-conductive material, such as silicon (e.g., without doping, oxidized, heated, or the like to provide insulating properties), polycrystalline silicon, glass, ceramic, and/or another insulator.

The spacer 108, in certain embodiments, may comprise one or more electrical contacts corresponding to one or more electrical contacts disposed on one or more of the dies 123 and/or the substrate 106, one or more conductive electrical traces, through-silicon-vias, and/or other electrical interconnects between at least a bottom integrated circuit device 123 and the substrate 106. In other embodiments, a spacer 108 does not comprise electrical contacts and/or electrical connections.

Figure 1B:
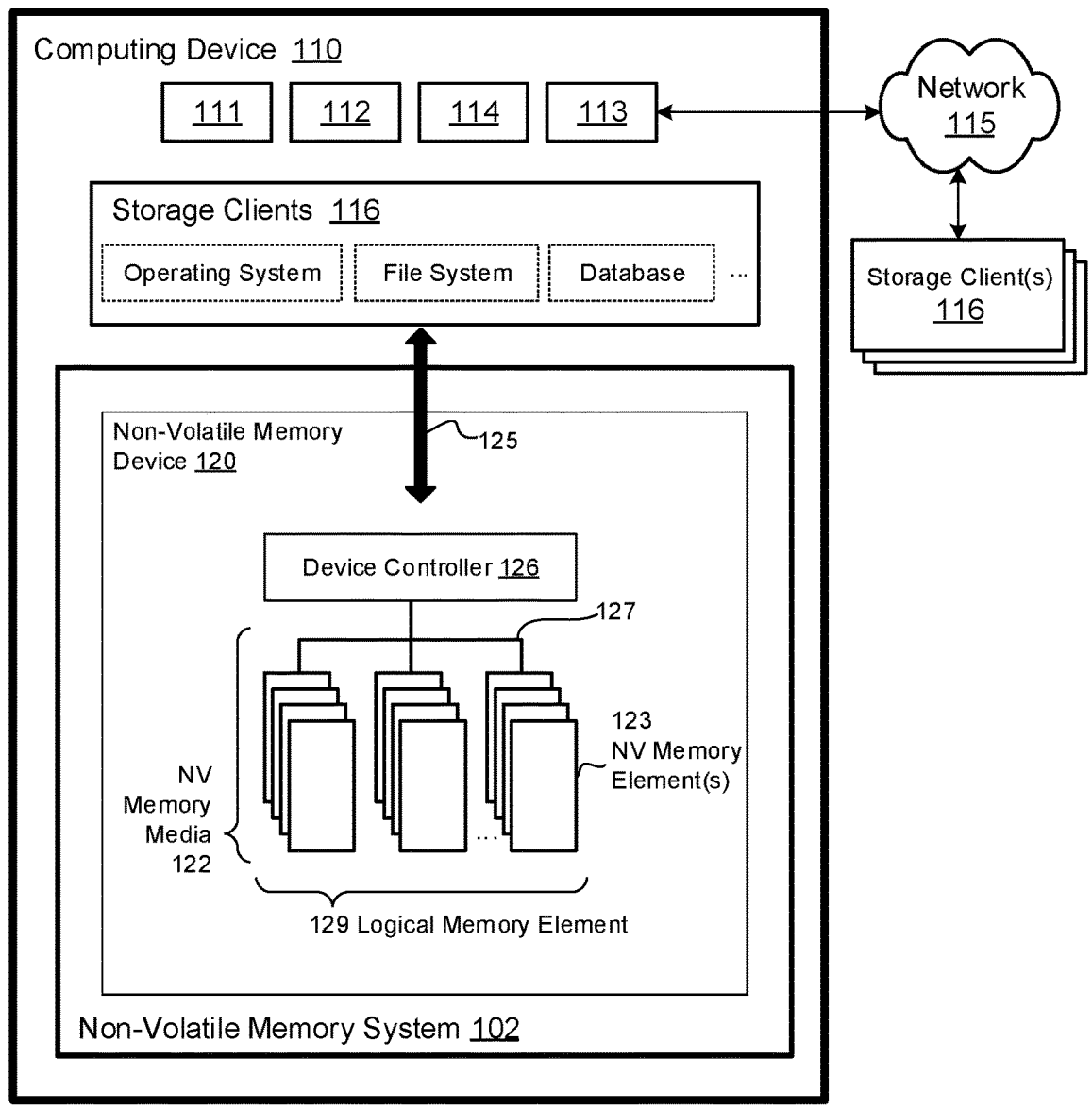
FIG. 1B is a schematic block diagram of a further embodiment of a system for a mechanical support structure for stacked integrated circuit dies.

FIG. 1B is a schematic block diagram of one embodiment of a system 101 for a mechanical support structure 104 for stacked dies 123. While a memory device 120 of a memory system 102 are used herein as one example of a system 101 for a plurality of stacked dies 123, in other embodiments, the plurality of dies 123 may comprise one or more network interface controller (NIC) dies 123, one or more graphical processing unit (GPU) dies 123, one or more central processing unit (CPU) dies 123, and/or one or more other types of dies 123 that transmit and/or receive data.

In some embodiments, a memory system 102 of a computing device 110 may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device 126 to a communication network 115, such as an Internet Protocol (IP) network, a Storage Area Network (SAN), wireless network, wired network, or the like.

The memory device 120, in various embodiments, may be disposed in one or more different locations relative to the computing device 110. In one embodiment, the memory device 120 comprises one or more volatile and/or non-volatile memory elements 123 (i.e., the stacked dies 123), such as semiconductor chips, dies, packages, or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

One or more dies 123 may comprise electrical interconnects (e.g., one or more local buses, back channels, sub-networks, internal networks, internal buses, bond wires, circuit traces, or the like) between the dies 123, so that one die 123 (e.g., an active integrated circuit) may send data to one or more other dies 123, and the dies 123 may transmit the data in parallel (e.g., to a device controller 126, to a processor 111, to a computer readable storage medium 114, over a data network 115, over a bus 125, 127, or the like).

According to various embodiments, a device controller 126 may manage one or more memory devices 120, memory elements (i.e., dies 123), and/or other integrated circuit devices. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units may include, but are not limited to: pages, memory divisions, blocks, sectors, collections or sets of physical storage locations (e.g., logical pages, logical blocks), or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more memory devices 120. Although FIG. 1B depicts a single memory device 120, the disclosure is not limited in this regard and could be adapted to incorporate any number of memory devices 120.

The memory device 120 may comprise one or more dies 123 of volatile and/or non-volatile memory media 122, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more dies 123 of memory media 122, in certain embodiments, comprise storage class memory (SCM).

While the memory media 122 is referred to herein as "memory media," in various embodiments, the memory media 122 may more generally comprise one or more volatile and/or non-volatile recording media capable of recording data, which may be referred to as a memory medium, a storage medium, or the like. Further, the memory device 120, in various embodiments, may comprise a recording device, a memory device, a storage device, or the like. Similarly, a memory element 123, in various embodiments, may comprise a recording element, a memory element, a storage element, or the like. In other embodiments, a memory element 123 may comprise a different type of integrated circuit device (e.g., an ASIC, a CPU, a communications device, a graphics device, a system on a chip, a programmable logic device, or the like), and memory elements 123 are used only by way of example as one type of integrated circuit device 123 (e.g., integrated circuit die, chip, die plane, package, or the like), and other types of integrated circuit devices are contemplated within the scope of this disclosure.

The memory media 122 may comprise one or more memory elements 123, which may include, but are not limited to: chips, packages, dies, die planes, or the like. A device controller 126 may be configured to manage data operations on the memory media 122, and may comprise one or more processors, programmable processors (e.g., FPGAs), ASICs, micro-controllers, or the like. In some embodiments, the device controller 126 is configured to store data on and/or read data from the memory media 122, to transfer data to/from the memory device 120, and so on.

The device controller 126 may be communicatively coupled to the memory media 122 and/or other dies 123 by way of a bus 127. The bus 127 may comprise an I/O bus for communicating data to/from the dies 123. The bus 127 may further comprise a control bus for communicating addressing and other command and control information to the dies 123. In some embodiments, the bus 127 may communicatively couple the dies 123 to the device controller 126 in parallel. This parallel access may allow the integrated circuit devices 123 to be managed as a group (e.g., in an embodiment where the dies 123 comprise memory elements, forming a logical memory element 129, or the like). A logical memory element 129 may be partitioned into respective logical memory units (e.g., logical pages) and/or logical memory divisions (e.g., logical blocks). The logical memory units may be formed by logically combining physical memory units of each of the dies 123.

Figure 2:
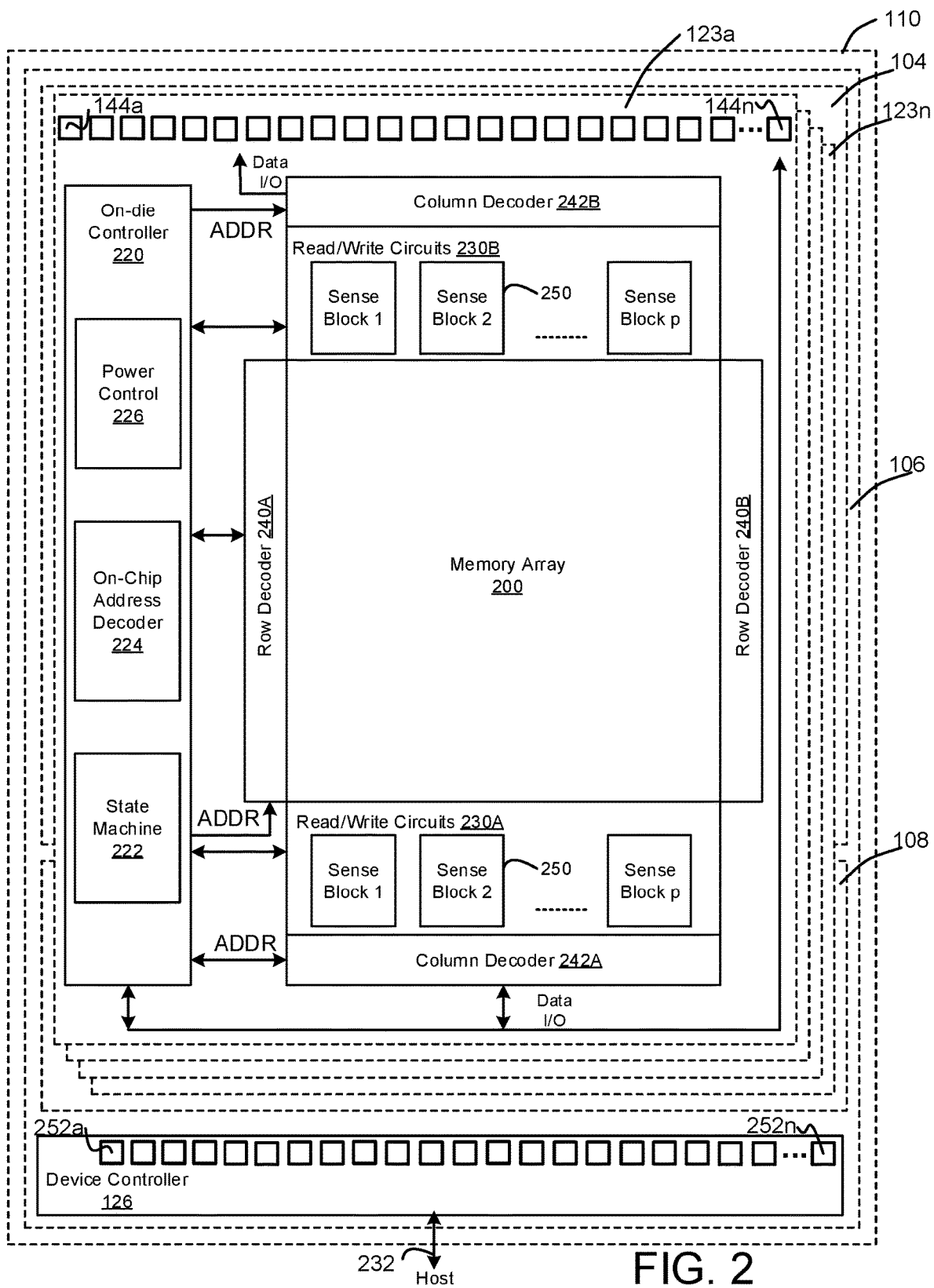
FIG. 2 is a schematic block diagram illustrating another embodiment of a system for a mechanical support structure for stacked integrated circuit dies.

FIG. 2 depicts one embodiment of a storage device 110 that may include one or more memory dies or chips 123a-n, and/or another type of integrated circuit device coupled to a mechanical support structure 104 and/or a spacer 108 via a plurality of input/output electrical contacts 144a-n. The storage device 110 may be substantially similar to the memory device 120 described with reference to FIG. 1B. Memory die 123a-n, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a device controller 126 is included in the same memory device 110 (e.g., a removable storage card or package) as the one or more memory die 123a-n. Commands and data are transferred between the host and the device controller 126 via lines 232 and between the device controller 126 and the one or more memory die 123a-n. One implementation can include multiple chips 123a-n, a chip 123a-n may include multiple dies 123a-n and/or die planes 123a-n, or the like.

The die controller 220, in one embodiment, cooperates with the read/write circuits 230A/230B to perform memory operations on the memory array 200. The die controller 220, in certain embodiments, includes a state machine 222, an on-die address decoder 224, and a power control circuit 226. The state machine 222, in one embodiment, provides die/chip-level control of memory operations. The on-die address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of die controller 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 126 can be referred to as one or more managing circuits.

In the depicted embodiment, the memory dies 123*a-n* include integrated circuit electrical contacts 144*a-n* and the device controller 126 includes integrated circuit electrical contacts 252*a-n*. As used herein, an electrical contact 144*a-n*, 252*a-n* comprises a conductive connection, such as a metallic pad, pin, port, trace, or the like. An electrical interconnect, as used herein, comprises an electrical communications channel, such as one or more local buses, back channels, sub-networks, internal networks, internal buses, bond wires, circuit traces, electric conductors, fiber optic connections, or the like.

Figure 3:
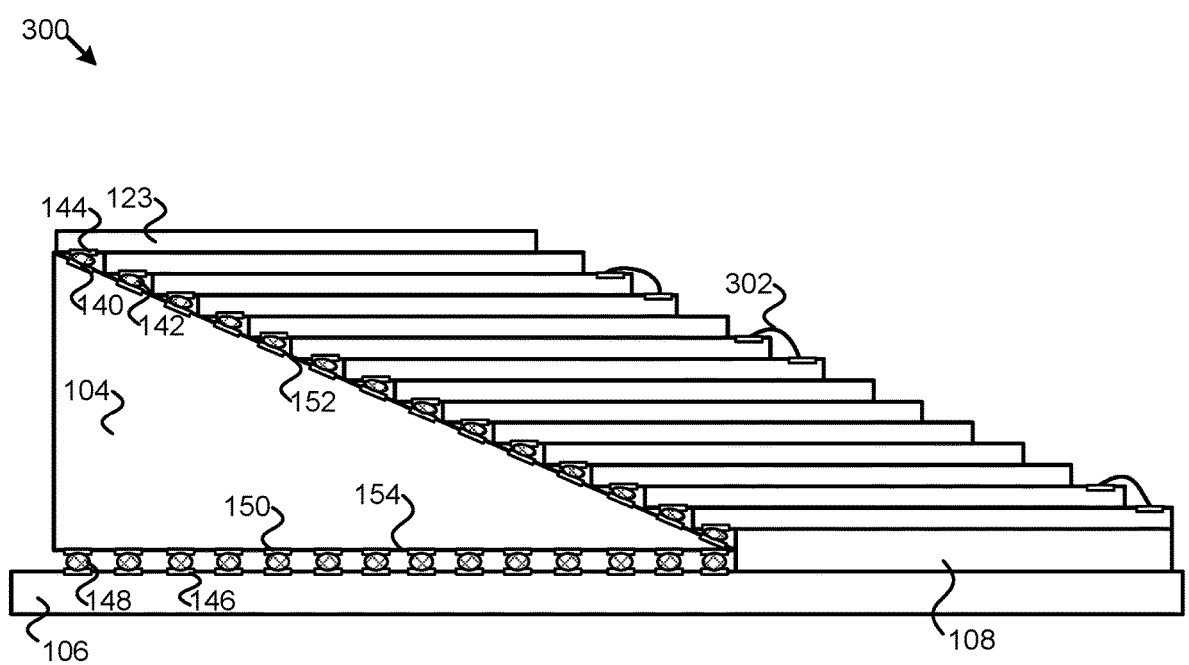
FIG. 3 is a schematic block diagram illustrating one embodiment of a system for a mechanical support structure for stacked integrated circuit dies.

FIG. 3 is a schematic block diagram illustrating one embodiment of a system 300 for a mechanical support structure 104 for stacked dies 123. In some embodiments, the system 300 may be substantially similar to the system 100 of FIG. 1A (e.g., a side view of the system 100, or the like).

The system 300 includes a mechanical support structure 104 (e.g., a sloped interconnector 104 or the like), a substrate 106, a spacer 108, and a plurality of stacked dies 123 with one or more interconnects 302. The mechanical support structure 104 includes a plurality of electrical contacts 140 coupled (e.g., with solder bumps 142 or the like) to corresponding integrated circuit device electrical contacts 144 (e.g., along edges of the dies 123 toward the mechanical support structure 104, or the like) and a plurality of electrical contacts 150 coupled (e.g., with solder bumps 148 or the like) to corresponding substrate electrical contacts 146 of the substrate 106.

One or more dies 123 may comprise electrical interconnects 302, such as the depicted bond wire interconnects 302, between different dies 123, so that one die 123 may send data to one or more other dies 123 independently of and/or in addition to communicating through the mechanical support structure 104. In other embodiments, different dies 123 may communicate through the mechanical support structure 104 and/or the substrate 106, without additional electrical interconnects 302.

Figure 4A:
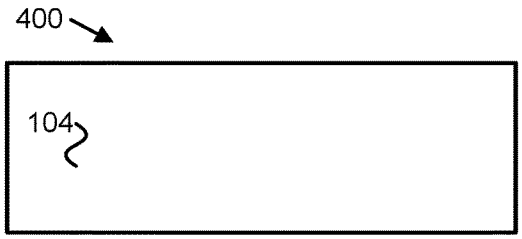
FIG. 4A is a schematic block diagram illustrating one embodiment of a mechanical support structure.

FIG. 4A is a schematic block diagram illustrating one embodiment of a manufacturing stage 400 for a mechanical support structure 104. In the depicted embodiment (e.g., a first manufacturing stage 400 or the like), the mechanical support structure 104 comprises a block of material, such as a block of silicon, polycrystalline silicon, glass, ceramic, or the like.

Figure 4B:
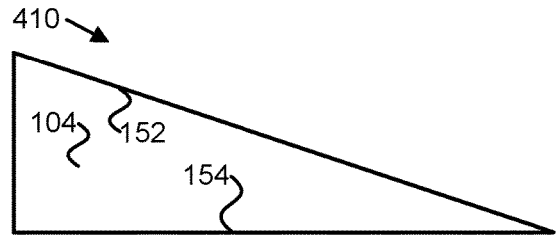
FIG. 4B is a schematic block diagram illustrating one embodiment of a mechanical support structure.

FIG. 4B is a schematic block diagram illustrating one embodiment of a manufacturing stage 410 for a mechanical support structure 104. In the depicted embodiment (e.g., a second manufacturing stage 410 or the like), the mechanical support structure 104 comprises a triangular wedge and/or another shape with a sloped surface 152 formed (e.g., cut, grinded, or the like) from a block of material (e.g., a block of silicon, polycrystalline silicon, glass, ceramic, or the like).

Figure 4C:
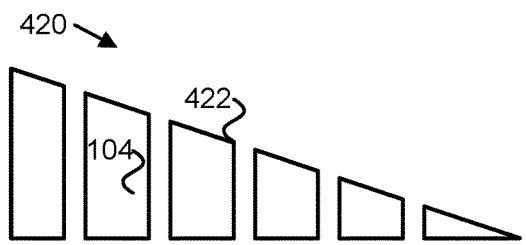
FIG. 4C is a schematic block diagram illustrating one embodiment of a mechanical support structure.

FIG. 4C is a schematic block diagram illustrating one embodiment of a manufacturing stage 420 for a mechanical support structure 104. In the depicted embodiment (e.g., a third manufacturing stage 420 or the like), through holes 422 (e.g., through-silicon-vias) have been formed in the mechanical support structure 104 (e.g., through drilling, laser ablation, or the like).

Figure 4D:
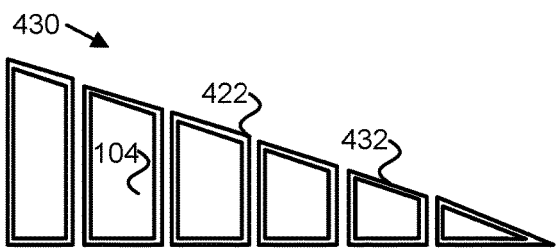
FIG. 4D is a schematic block diagram illustrating one embodiment of a mechanical support structure.

FIG. 4D is a schematic block diagram illustrating one embodiment of a manufacturing stage 430 for a mechanical support structure 104. In the depicted embodiment (e.g., a fourth manufacturing stage 430 or the like), a liner 432 has been formed over the mechanical support structures 104 including through holes 422 (e.g., through-silicon-vias). For example, a liner 432 may comprise silicon oxide (e.g., formed by oxide deposition or the like), a diffusion barrier, a polymer, or the like.

Figure 4E:
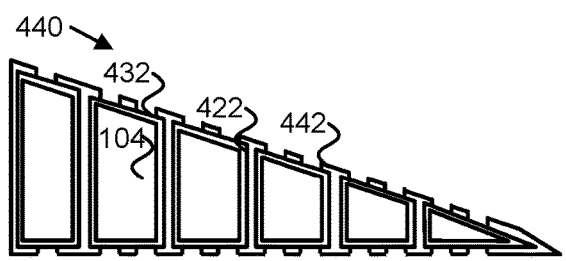
FIG. 4E is a schematic block diagram illustrating one embodiment of a mechanical support structure.

FIG. 4E is a schematic block diagram illustrating one embodiment of a manufacturing stage 440 for a mechanical support structure 104. In the depicted embodiment (e.g., a fifth manufacturing stage 440 or the like), a metallization process has been performed (e.g., copper seed formation, copper electroplating, electrical trace pattern formation via lithography and/or chemical etching, or the like) to form one or more conductive paths 442. For example, the metallization process may deposit metal 442 and/or another conductor 442 in through-silicon-vias 422, over the liner 432, and/or in other locations in and/or around the mechanical support structure 104, or the like.

Figure 4F:
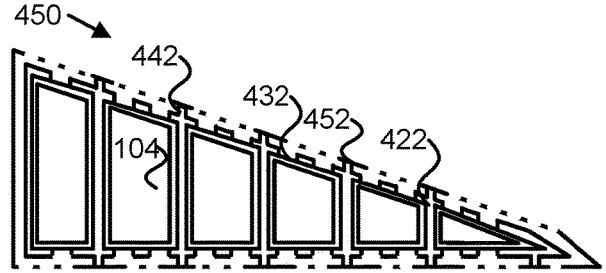
FIG. 4F is a schematic block diagram illustrating one embodiment of a mechanical support structure.
Figure 4G:
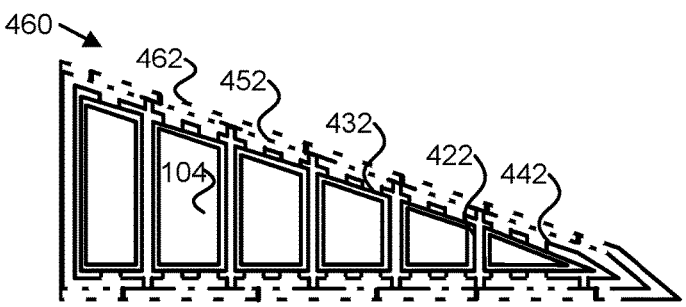
FIG. 4G is a schematic block diagram illustrating one embodiment of a mechanical support structure.

FIG. 4F is a schematic block diagram illustrating one embodiment of a manufacturing stage 450 and FIG. 4G is a schematic block diagram illustrating one embodiment of a manufacturing stage 460 for a mechanical support structure 104. In the depicted embodiments (e.g., a sixth manufacturing stage 450, a seventh manufacturing stage 460, or the like), one or more additional deposition and/or metallization processes have been performed on the mechanical support structure 104, forming one or more additional conductive paths 452, 462 (e.g., electrical contacts/pads, electrical traces, redistribution layers, or the like) with insulator layers (e.g., oxide layers, diffusion barriers, or the like) therebetween.

In certain embodiments, one or more conductive paths 462 may comprise electrical contacts 140 on a sloped surface 152 of the mechanical support structure 104 for interfacing with integrated circuit electrical contacts 144 on dies 123, one or more conductive paths 462 may comprise electrical contacts 154 on a different surface 154 of the mechanical support structure 104 for interfacing with substrate electrical contacts 146 of a substrate 106, or the like.

Figure 5A:
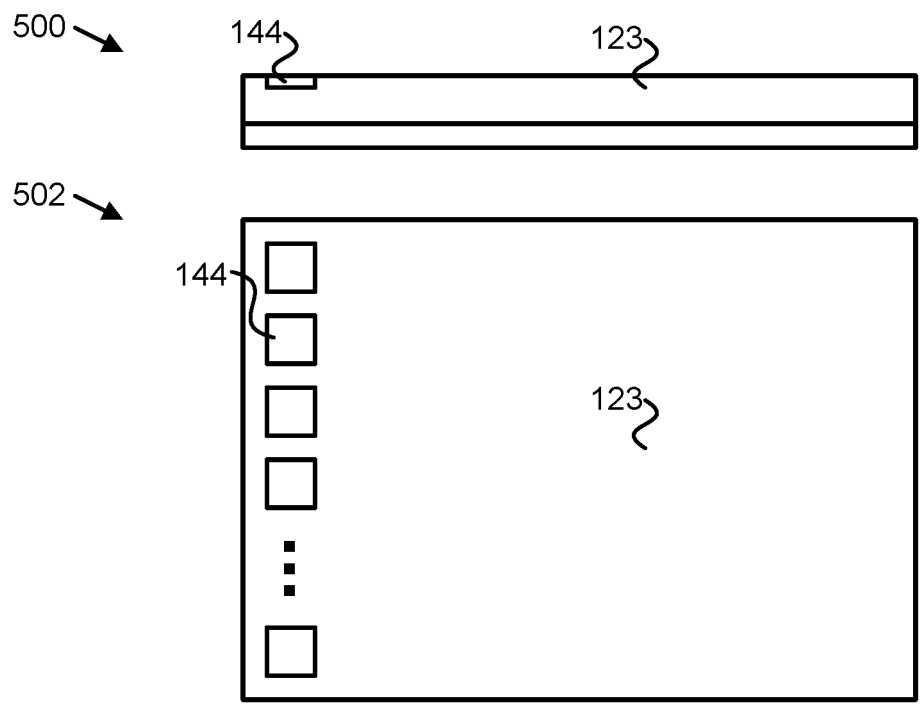
FIG. 5A is a schematic block diagram illustrating a side view and a bottom view of one embodiment of an integrated circuit die.

FIG. 5A is a schematic block diagram illustrating a side view 500 and a bottom view 502 of one embodiment of a die 123 with a row of integrated circuit device electrical contacts 144. In the depicted embodiment, the integrated circuit device electrical contacts 144 do not include solder bumps 142 and/or solder balls 142. For example, solder bumps 142 and/or solder balls 142 may have been deposited on electrical contacts 140 of a mechanical support structure 104, may not yet have been deposited on the integrated circuit device electrical contacts 144, or the like. The integrated circuit device electrical contacts 144, in the depicted embodiment, are arranged in a row along an edge of the die 123, in order to align with corresponding electrical contacts 140 along a sloped surface 152 of a mechanical support structure 104 or the like.

Figure 5B:
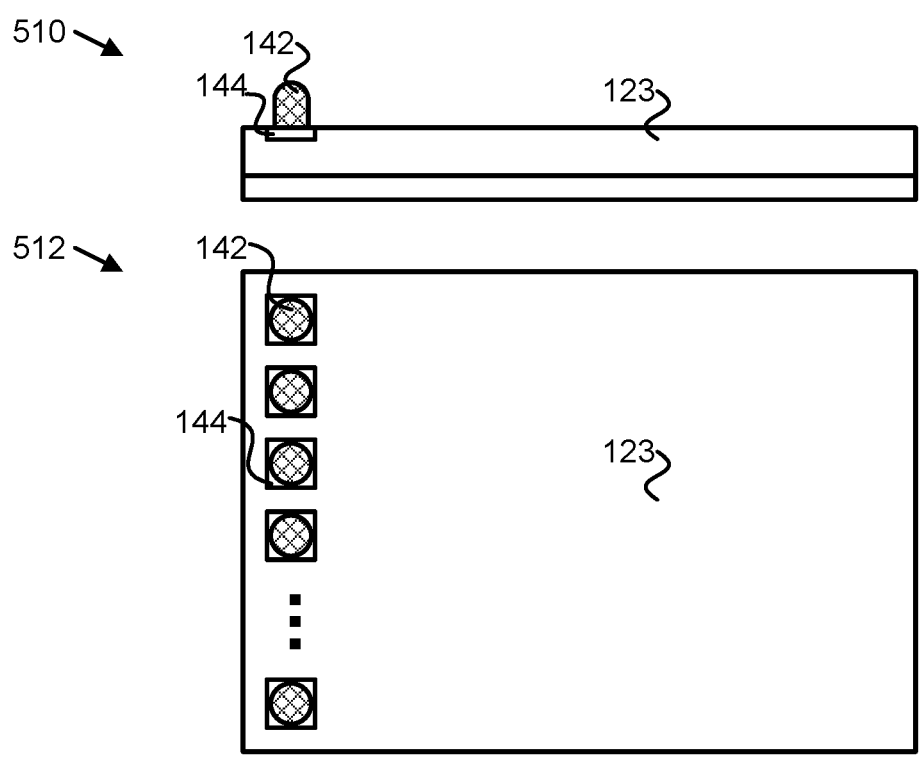
FIG. 5B is a schematic block diagram illustrating a side view and a bottom view of a further embodiment of an integrated circuit die.

FIG. 5B is a schematic block diagram illustrating a side view 510 and a bottom view 512 of a further embodiment of a die 123 with a row of integrated circuit device electrical contacts 144. In the depicted embodiment, the integrated circuit device electrical contacts 144 include solder bumps 142 and/or solder balls 142. For example, solder bumps 142 and/or solder balls 142 may have been deposited on the integrated circuit device electrical contacts 144 in a ball grid array and/or flip chip type configuration, or the like, for coupling (e.g., during reflow or the like) with corresponding electrical contacts 140 along a sloped surface 152 of a mechanical support structure 104 or the like.

Figure 6:
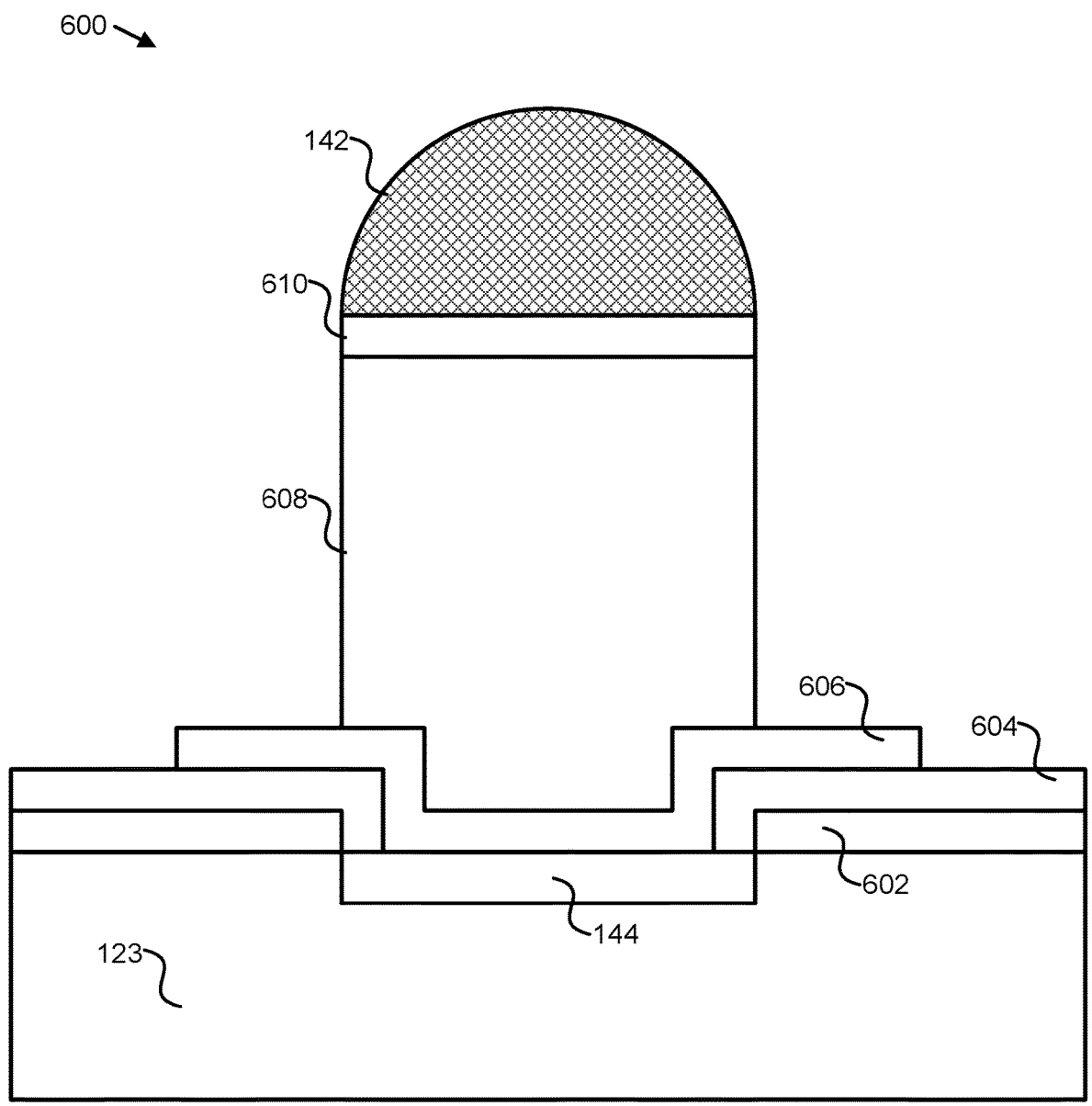
FIG. 6 is a schematic block diagram illustrating one embodiment of an electrical contact.

FIG. 6 is a schematic block diagram illustrating one embodiment of an electrical contact 600. In the depicted embodiment, the electrical contact 600 includes a conductive pillar 608 (e.g., a copper pillar 608 and/or another metallic pillar 608a) deposited and/or otherwise formed on an electrical contact pad 144 of an integrated circuit device 123, with a passivation layer 602, a polymide layer 604, an underbump metallization (UBM) layer 606 providing a base for the conductive pillar 608 and a nickel layer 610 and solder cap 142 disposed on the conductive pillar 608. While an electrical contact pad 144 of an integrated circuit device 123 is depicted by way of example, in other embodiments, a passivation layer 602, a polymide layer 604, a UBM layer 606, a conductive pillar 608, a nickel layer 610, and/or a solder cap 142 may be disposed on an electrical contact pad 140 of a mechanical support structure 104, on an electrical contact pad 146 of a substrate 106, or the like.

Figure 7A:
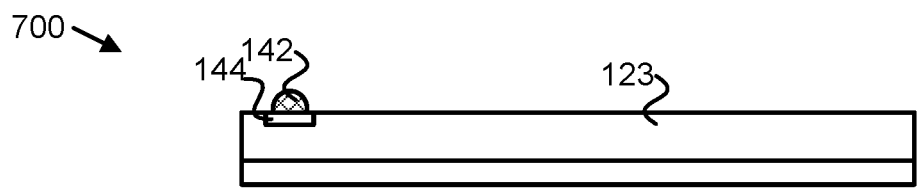
FIG. 7A is a schematic block diagram illustrating one embodiment of an integrated circuit die.

FIG. 7A is a schematic block diagram illustrating one embodiment 700 of a die 123. The die 123, in the depicted embodiment, has a single row of electrical contacts 144 with solder bumps 142 and/or conductive pillars 142 each having a similar height, for interfacing with corresponding electrical contacts 140 of a mechanical support structure 104, or the like.

Figure 7B:
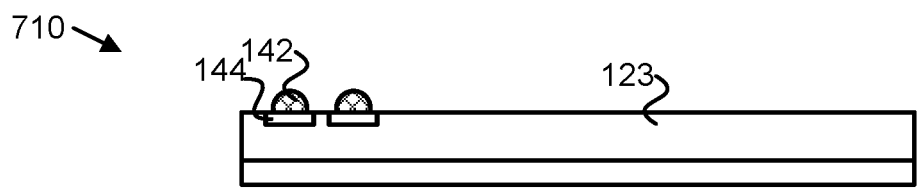
FIG. 7B is a schematic block diagram illustrating one embodiment of an integrated circuit die.

FIG. 7B is a schematic block diagram illustrating one embodiment 710 of a die 123. The die 123, in the depicted embodiment, has two rows of electrical contacts 144 with solder bumps 142 and/or conductive pillars 142 each having a similar height, for interfacing with corresponding electrical contacts 140 of a mechanical support structure 104, or the like.

Figure 7C:
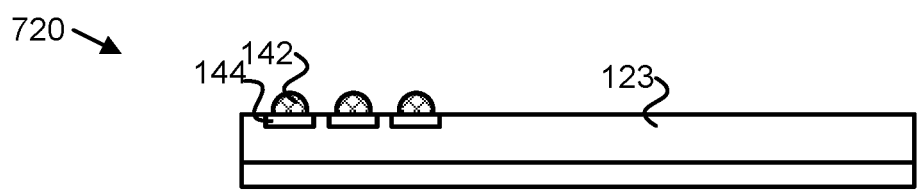
FIG. 7C is a schematic block diagram illustrating one embodiment of an integrated circuit die.

FIG. 7C is a schematic block diagram illustrating one embodiment 720 of a die 123. The die 123, in the depicted embodiment, has three rows of electrical contacts 144 with solder bumps 142 and/or conductive pillars 142 each having a similar height, for interfacing with corresponding electrical contacts 140 of a mechanical support structure 104, or the like.

Figure 7D:
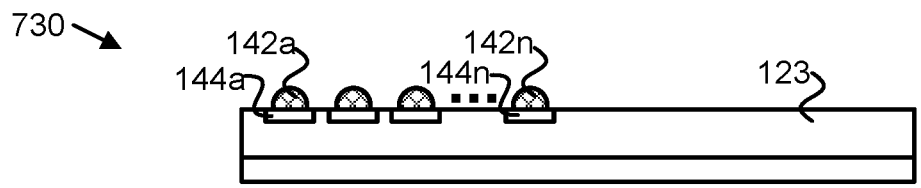
FIG. 7D is a schematic block diagram illustrating one embodiment of an integrated circuit die.

FIG. 7D is a schematic block diagram illustrating one embodiment of a die 123. The die 123, in the depicted embodiment, has N rows of electrical contacts 144a-n with solder bumps 142a-n and/or conductive pillars 142a-n each having a similar height, for interfacing with corresponding electrical contacts 140a-n of a mechanical support structure 104, or the like. In embodiments where multiple rows of electrical contacts 144a-n, solder bumps 142a-n, and/or conductive pillars 142a-n have a same height, a corresponding mechanical support structure 104 may have a sloped surface 152 with a small enough angle in order to couple with each without different heights, or electrical contacts 140a-n, solder bumps 142a-n, and/or conductive pillars 142a-n disposed on the mechanical support structure 104 may have different heights to compensate for an angel or the mechanical support structure 104, or the like.

Figure 8A:
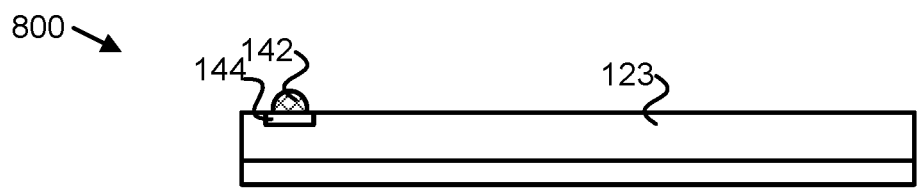
FIG. 8A is a schematic block diagram illustrating one embodiment of an integrated circuit die.

FIG. 8A is a schematic block diagram illustrating one embodiment of a die 123. The die 123, in the depicted embodiment, has a single row of electrical contacts 144 with solder bumps 142 and/or conductive pillars 142 each having a similar height, for interfacing with corresponding electrical contacts 140 of a mechanical support structure 104, or the like.

Figure 8B:
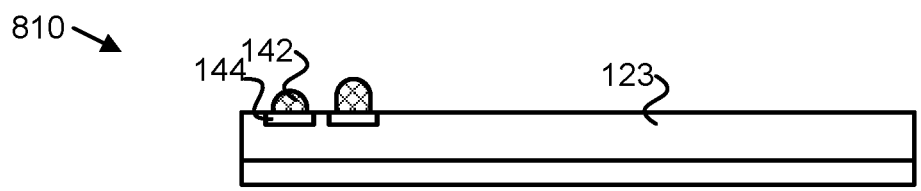
FIG. 8B is a schematic block diagram illustrating one embodiment of an integrated circuit die.

FIG. 8B is a schematic block diagram illustrating one embodiment of a die 123. The die 123, in the depicted embodiment, has two rows of electrical contacts 144 with solder bumps 142 and/or conductive pillars 142 having different heights, for interfacing with corresponding electrical contacts 140 of a mechanical support structure 104 in a manner that compensates for an angle of a sloped surface 152 of the mechanical support structure 104, or the like.

Figure 8C:
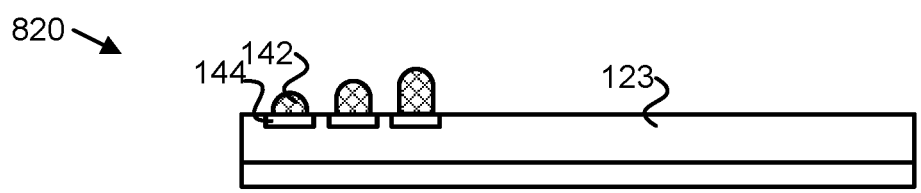
FIG. 8C is a schematic block diagram illustrating one embodiment of an integrated circuit die.

FIG. 8C is a schematic block diagram illustrating one embodiment of a die 123. The die 123, in the depicted embodiment, has three rows of electrical contacts 144 with solder bumps 142 and/or conductive pillars 142 having different heights, for interfacing with corresponding electrical contacts 140 of a mechanical support structure 104 in a manner that compensates for an angle of a sloped surface 152 of the mechanical support structure 104, or the like.

Figure 8D:
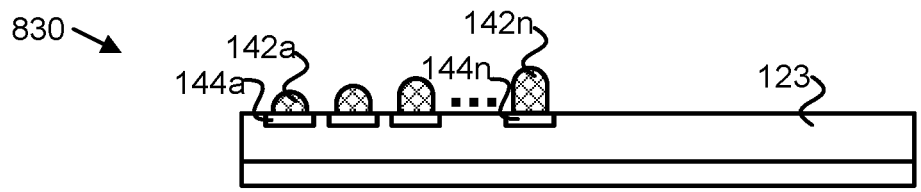
FIG. 8D is a schematic block diagram illustrating one embodiment of an integrated circuit die.

FIG. 8D is a schematic block diagram illustrating one embodiment of a die 123. The die 123, in the depicted embodiment, has N rows of electrical contacts 144a-n with solder bumps 142a-n and/or conductive pillars 142a-n having different heights, for interfacing with corresponding electrical contacts 140a-n of a mechanical support structure 104 in a manner that compensates for an angle of a sloped surface 152 of the mechanical support structure 104, or the like.

Figure 9:
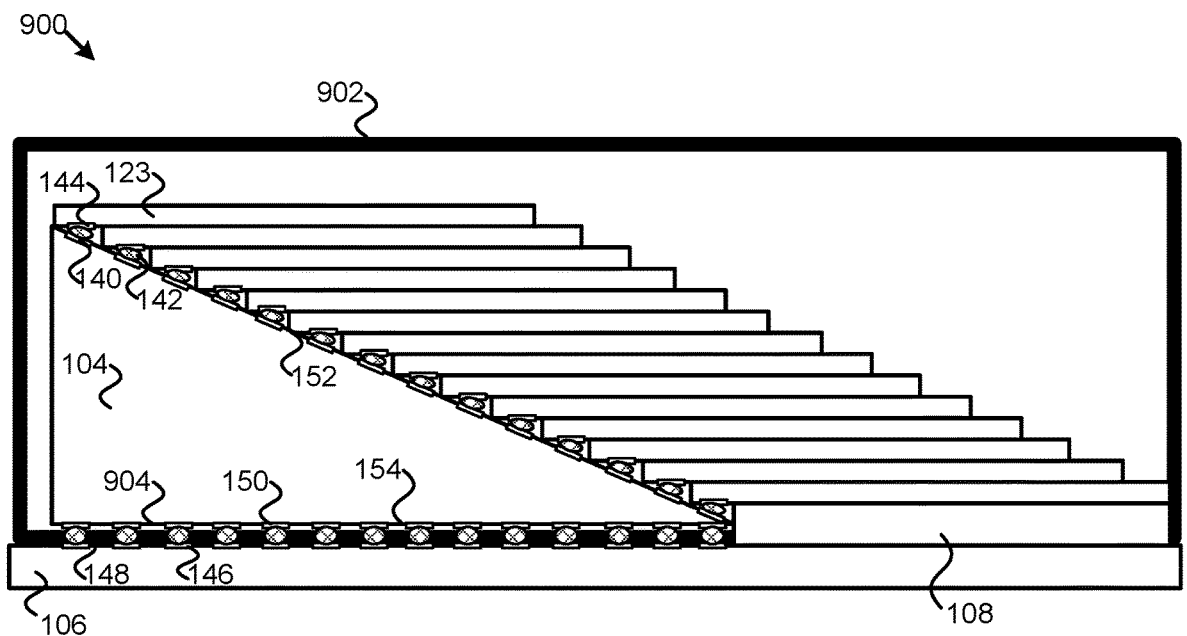
FIG. 9 is a schematic block diagram illustrating one embodiment of a package for a mechanical support structure and a stack of integrated circuit dies.

FIG. 9 is a schematic block diagram illustrating a packaged device 900 having an encapsulation material 902 and underfill 904 for a mechanical support structure 104 and a stack of dies 123. The encapsulation material 902 may comprise a resin, plastic or other polymer, ceramic, and/or other sturdy material that houses and/or encapsulates the dies 123 and the mechanical support structure 104, with one or more electrical traces, pins, contacts, or the like extending from the dies 123 (e.g., through the mechanical support structure 104 and/or the substrate 106) through the package 902 or other housing for external electrical communications out of the package.

In the depicted embodiment of the packaged device 900, the encapsulation material 902 encapsulates the mechanical support structure 104, the dies 123, and the spacer 108, but not the substrate 106. That is, a bottom surface of the substrate 106 is exposed. In other embodiments, the encapsulation material 902 may partially encapsulate the substrate 106, may completely encapsulate the substrate 106, or the like.

In one embodiment, the packaged device 900 includes an underfill 904 between the mechanical support structure 104 and the substrate 106, around the substrate electrical contacts 146, solder 148/conductive pillars 148, and/or mechanical support structure 104 electrical contacts 150, or the like. For example, an underfill 904 may comprise an epoxy, a resin, and/or another material to protect the bonds between the mechanical support structure 104 and the substrate 106 during encapsulation by the package 902. In other embodiments, no underfill 904 may be used, or the like.

Figure 10:
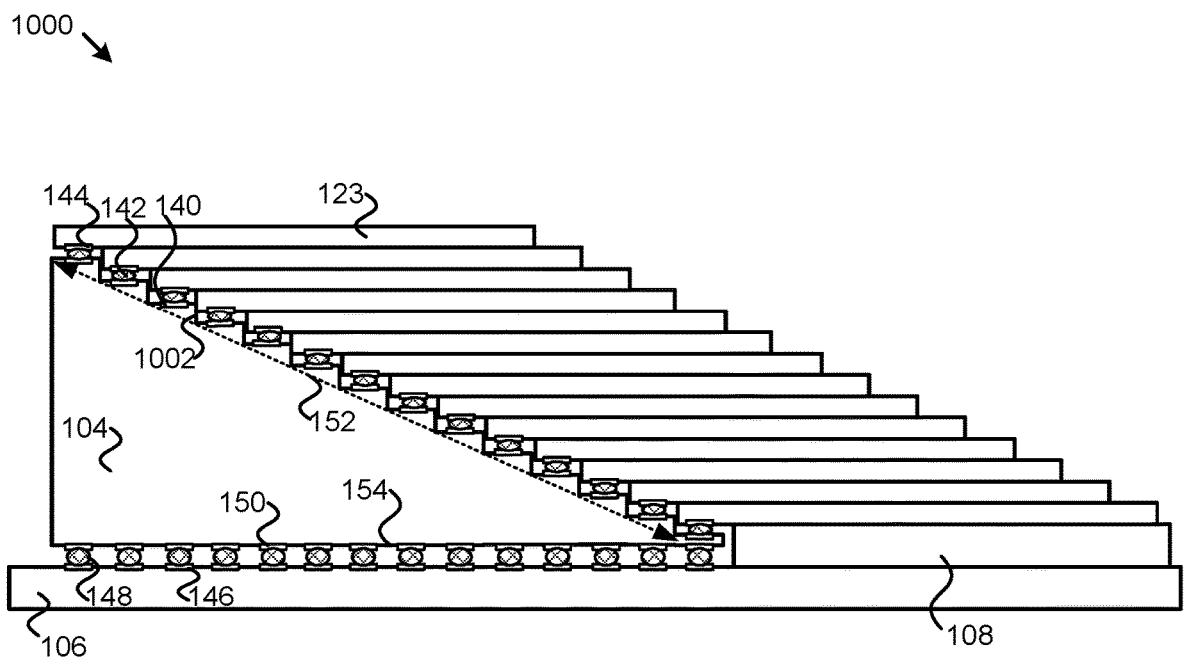
FIG. 10 is a schematic block diagram illustrating one embodiment of a system for a mechanical support structure for stacked integrated circuit dies.

FIG. 10 is a schematic block diagram illustrating one embodiment of a system 1000 for a mechanical support structure 104 for stacked integrated circuit dies 123. The sloped surface 152 of the system 1000 comprises one or more steps 1002, which may be cutout, molded, and/or otherwise formed into the sloped surface 152. One or more steps 1002 may correspond to and/or be shaped to receive one or more of the integrated circuit devices 123 (e.g., without different heights of electrical contacts 144, solder bumps 142, conductive pillars 142, or the like to compensate for the angle of the sloped surface 152). An overall slope and/or overall angle of a sloped surface 152 with one or more steps 1002 may be measured from one end and/or edge of the mechanical support structure 104 to an opposite end and/or edge of the mechanical support structure 104, so that the overall slope and/or overall angle is non-perpendicular and/or non-parallel with regard to one or more other surfaces of the mechanical support structure 104 (e.g., sloped), even if surfaces of the step 1004 are parallel and/or perpendicular to one or more other surfaces of the mechanical support structure 104.

Figure 11:
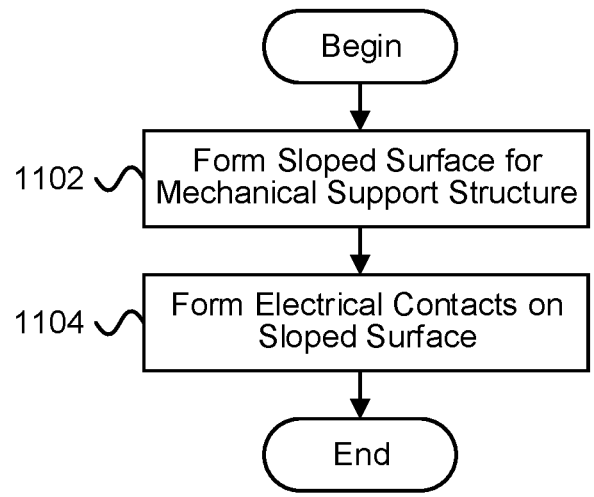
FIG. 11 is a flow chart illustrating one embodiment of a method for forming a mechanical support structure.

FIG. 11 is a flow chart illustrating one embodiment of a method 1100 for forming a mechanical support structure 104. A manufacturer (i.e., an assembly house), as used herein, comprises factory that takes wafers having a plurality of integrated circuit dies and packaging the dies into integrated circuit devices, such as solid-state memory devices.

The method 1100 begins and a manufacturer forms 1102a sloped surface 152 for a mechanical support structure 104 from, for example, a blank silicon block or a blank silicon block that has pre-drilled vias. The manufacturer forms 1104a plurality of electrical contacts 144 on the sloped surface 152 and the method 1100 ends.

Figure 12:
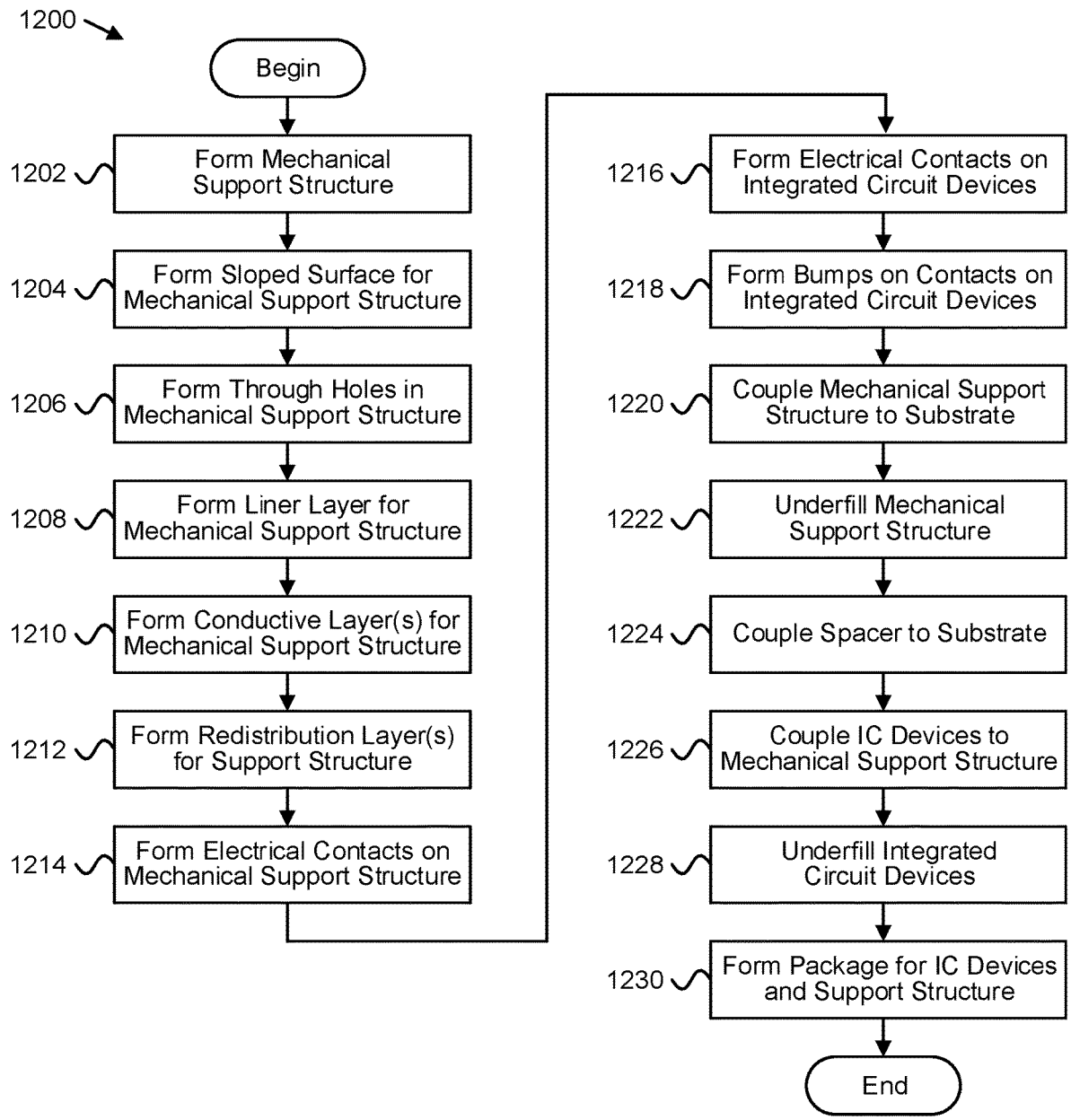
FIG. 12 is a flow chart illustrating one embodiment of a method for forming a mechanical support structure and a plurality of stacked integrated circuit dies.

FIG. 12 is a flow chart illustrating one embodiment of a method 1200 for forming a mechanical support structure 104 and a plurality of stacked dies 123. The method 1200 begins and a manufacturer forms 1202 a mechanical support structure 104. A manufacturer forms 1204 a sloped surface 152 for the formed 1202 mechanical support structure 104.

A manufacturer forms 1206 (e.g., drills, laser ablates, or the like) one or more through holes 422 (e.g., through-silicon-vias or the like) in the mechanical support structure 104. The manufacturer forms 1208 a liner layer 432 for the mechanical support structure 104. The manufacturer forms 1210 one or more conductive layers for the mechanical support structure 104 (e.g., alternating with insulator layers or the like). The manufacturer forms 1212 one or more redistribution layers for the mechanical support structure 104. A manufacturer forms 1214 a plurality of electrical contacts 140, 150 on the mechanical support structure 104 (e.g., on a sloped surface 152 for interfacing with dies 123, on a different surface 154 for interfacing with a substrate 106, or the like).

The manufacturer forms 1216 a plurality of electrical contacts 144 on a plurality of dies 123. The manufacturer forms 1218 solder bumps 142 and/or conductive pillars 142 on the formed 1216 electrical contacts 144 on the dies 123. The manufacturer couples 1220 (e.g., using a solder reflow process or the like) the mechanical support structure 104 to a substrate 106. The manufacturer underfills 1222 the mechanical support structure 104 (e.g., between the mechanical support structure 104 and the substrate 106, or the like).

The manufacturer couples 1224 a spacer 108 to the substrate 106 (e.g., using an adhesive, a solder reflow process, or the like). The manufacturer forms a stacked die structure and couples 1226 the stacked dies 123 to the mechanical support structure 104 (e.g., soldering electrical contacts 144 of the dies 123 to corresponding electrical contacts 140 on a sloped surface 152 of the mechanical support structure 104 using a solder 142 reflow process, or the like). The manufacturer underfills 1228 the dies 123 (e.g., between the dies 123 and the mechanical support structure 104, between the dies 123 themselves, between a bottom integrated circuit device 123 and the spacer 108, or the like). The manufacturer forms 1230 a package 902 around both the dies 123 and the mechanical support structure 104 and the method 1200 ends.

A means for mechanically supporting a plurality of laterally offset, stacked, dies 123, in various embodiments, may include a mechanical support structure 104, a substrate 106, a spacer 108, underfill 904, a package 902, solder 142, 148, conductive pillars 142, 148, 608, other hardware, or the like. Other embodiments may include similar or equivalent means for mechanically supporting a plurality of laterally offset, stacked, dies 123.

A means for providing electrical communication between integrated circuit device electrical contacts 144 and a substrate 106, in various embodiments, may include a mechanical support structure 104, solder 142, 146, conductive pillars 142, 148, 608, substrate electrical contacts 146, electrical contacts 150 on a different side 154 of the mechanical support structure 104, electrical traces, through holes, through-silicon-vias, conductive layers, redistribution layers, other hardware, or the like. Other embodiments may include similar or equivalent means for providing electrical communication between integrated circuit device electrical contacts 144 and a substrate 106.

A means for compensating for a non-perpendicular and/or non-parallel angle of a sloped surface 152, in various embodiments, may include conductive pillars 142, 148, 608, integrated circuit device electrical contacts 144, solder bumps 142 and/or solder balls 142, a spacer 108, other hardware, or the like. Other embodiments may include similar or equivalent means for means for compensating for a non-perpendicular and non-parallel angle of a sloped surface 152.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

The invention claimed is:

1. An apparatus, comprising:
a mechanical support structure for supporting a plurality of integrated circuit dies, the mechanical support structure comprising a structure that is separate from the plurality of integrated circuit dies, the plurality of integrated circuit dies selectively coupled to the mechanical support structure;
a sloped surface of the mechanical support structure, the sloped surface disposed at a non-perpendicular and non-parallel angle to other surfaces of the mechanical support structure; and
a plurality of first electrical contacts disposed on the sloped surface of the mechanical support structure for electrically interfacing with the plurality of integrated circuit dies,
wherein the plurality of integrated circuit dies are stacked and laterally offset relative to each other such that a plurality of device electrical contacts along edges of the plurality of integrated circuit dies are aligned to interface with the plurality of first electrical contacts disposed on the sloped surface of the mechanical support structure, and wherein the plurality of device electrical contacts comprise at least two rows of electrical contacts on a single integrated circuit die of the plurality of integrated circuit dies, the at least two rows of electrical contacts have different heights, and the different heights are selected to compensate for the non-perpendicular and non-parallel angle of the sloped surface of the mechanical support structure.

2. The apparatus of claim 1, wherein at least one row of the at least two rows of electrical contacts comprises conductive pillars.

3. The apparatus of claim 1, further comprising:
a substrate upon which the mechanical support structure is mounted; and
a second plurality of electrical contacts disposed on a different surface of the mechanical support structure for electrically interfacing with the substrate, thereby enabling electrical communication between the substrate and the plurality of integrated circuit dies.

4. The apparatus of claim 3, wherein the second plurality of electrical contacts are in electrical communication with the first plurality of electrical contacts such that the mechanical support structure provides electrical connections between the plurality of integrated circuit dies and the substrate.

5. The apparatus of claim 4, further comprising a plurality of through-silicon-vias disposed within the mechanical support structure between the sloped surface and the different surface, the through-silicon-vias providing the electrical communication between the first and second pluralities of electrical contacts.

6. The apparatus of claim 3, further comprising a plurality of electrical traces disposed in one or more of the sloped surface and the different surface providing electrical communications between the first and second pluralities of electrical contacts.

7. The apparatus of claim 6, wherein at least a portion of the plurality of electrical traces comprise a redistribution layer making at least a portion of the first and second pluralities of electrical contacts available in another location on the mechanical support structure.

8. The apparatus of claim 3, further comprising a spacer disposed between the plurality of stacked integrated circuit dies and the substrate, the spacer providing mechanical support to the plurality of integrated circuit dies and aligning the plurality of integrated circuit dies with the first plurality of electrical contacts.

9. The apparatus of claim 1, further comprising an encapsulation material formed around both the plurality of integrated circuit dies and the mechanical support structure.

10. The apparatus of claim 1, further comprising a plurality of electrical interconnects between the plurality of integrated circuit dies.

11. The apparatus of claim 1, wherein the sloped surface comprises a plurality of steps and an overall angle of the plurality of steps comprises the non-perpendicular and non-parallel angle of the sloped surface with regard to the other surfaces of the mechanical support structure.

12. The apparatus of claim 1, wherein the mechanical support structure comprises an insulator, the insulator comprising one or more of silicon, glass, ceramic, and polycrystalline silicon.

13. An apparatus, comprising:
means for mechanically supporting a plurality of laterally offset, stacked, integrated circuit devices, the means comprising a structure that is separate from the plurality of integrated circuit devices, the plurality of laterally offset, stacked, integrated circuit devices selectively coupled to the structure;
means for providing electrical communication between integrated circuit device electrical contacts along stacked, overhanging edges of the plurality of laterally offset, stacked, integrated circuit devices and a substrate through the means for mechanically supporting the plurality of laterally offset, stacked, integrated circuit devices;
a sloped surface of the mechanically supporting means, the sloped surface disposed at a non-perpendicular and non-parallel angle to other surfaces of the mechanically support means; and
a plurality of first electrical contacts disposed on the sloped surface of the mechanically supporting means for electrically interfacing with the plurality of laterally offset, stacked, integrated circuit devices,
wherein the plurality of laterally offset, stacked, integrated circuit devices are stacked and laterally offset relative to each other such that a plurality of device electrical contacts along edges of the plurality of laterally offset, stacked, integrated circuit devices are aligned to interface with the plurality of first electrical contacts disposed on the sloped surface of the mechanically supporting means, and
wherein the plurality of device electrical contacts comprise at least two rows of electrical contacts on a single integrated circuit device of the plurality of laterally offset, stacked, integrated circuit devices, the at least two rows of electrical contacts have different heights, and the different heights are selected to compensate for the non-perpendicular and non-parallel angle of the sloped surface of the mechanically supporting means.

14. The apparatus of claim 13, further comprising means for compensating for a non-perpendicular and non-parallel angle of the means for mechanically supporting the plurality of laterally offset, stacked, integrated circuit devices in order to provide the electrical communication between the integrated circuit device electrical contacts and the substrate.

* * * * *